US009058993B2

(12) United States Patent
Wang et al.

(10) Patent No.: US 9,058,993 B2
(45) Date of Patent: Jun. 16, 2015

(54) METHODS FOR MAKING LARGE-AREA, FREE-STANDING METAL OXIDE FILMS

(71) Applicant: Wisconsin Alumni Research Foundation, Madison, WI (US)

(72) Inventors: Xudong Wang, Madison, WI (US); Zhenqiang Ma, Middleton, WI (US); Fei Wang, Madison, WI (US); Jung-Hun Seo, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 13/892,446

(22) Filed: May 13, 2013

(65) Prior Publication Data

US 2014/0134793 A1 May 15, 2014

Related U.S. Application Data

(62) Division of application No. 12/723,190, filed on Mar. 12, 2010, now Pat. No. 8,502,218.

(51) Int. Cl.
*H01L 29/12* (2006.01)
*H01L 21/02* (2006.01)
*C30B 7/14* (2006.01)
*C30B 29/16* (2006.01)
*H01L 29/786* (2006.01)
*H01L 33/28* (2010.01)

(52) U.S. Cl.
CPC ............ *H01L 21/02628* (2013.01); *C30B 7/14* (2013.01); *C30B 29/16* (2013.01); *H01L 21/02554* (2013.01); *H01L 29/7869* (2013.01); *H01L 33/28* (2013.01); *H01L 21/0259* (2013.01)

(58) Field of Classification Search
USPC .......................................................... 438/104
See application file for complete search history.

(56) References Cited

U.S. PATENT DOCUMENTS

| 4,539,061 | A | * | 9/1985 | Sagiv ............................ 156/278 |
| 5,545,432 | A | * | 8/1996 | DeGuire et al. .............. 427/226 |
| 8,043,889 | B1 | * | 10/2011 | Ulmer et al. .................. 438/104 |
| 8,535,973 | B2 | * | 9/2013 | Jang et al. ........................ 438/99 |
| 8,536,618 | B2 | * | 9/2013 | Richardson et al. .......... 257/183 |
| 2004/0016646 | A1 | * | 1/2004 | Stucky et al. ................. 205/111 |
| 2004/0185251 | A1 | * | 9/2004 | Wang et al. ................... 428/397 |
| 2007/0113779 | A1 | * | 5/2007 | Wong et al. ..................... 117/84 |

(Continued)

OTHER PUBLICATIONS

Ding et al, "Ordered zinc-vacancy induced Zn0.75Ox naophase structure", Solid State Communications 138 (2006) 390-394.*

(Continued)

*Primary Examiner* — Jarrett Stark
*Assistant Examiner* — Charles N Ausar-El
(74) *Attorney, Agent, or Firm* — Bell & Manning, LLC

(57) ABSTRACT

The present invention provides continuous, free-standing metal oxide films and methods for making said films. The methods are able to produce large-area, flexible, thin films having one or more continuous, single-crystalline metal oxide domains. The methods include the steps of forming a surfactant monolayer at the surface of an aqueous solution, wherein the headgroups of the surfactant molecules provide a metal oxide film growth template. When metal ions in the aqueous solution are exposed to the metal oxide film growth template in the presence of hydroxide ions under suitable conditions, a continuous, free-standing metal oxide film can be grown from the film growth template downward into the aqueous solution.

15 Claims, 13 Drawing Sheets

(56) References Cited

U.S. PATENT DOCUMENTS

2008/0056984 A1* 3/2008 Yoshioka et al. ............. 423/622
2008/0312070 A1* 12/2008 Talbot et al. .................... 502/80
2009/0098353 A1* 4/2009 Kunitake et al. ............. 428/213

OTHER PUBLICATIONS

McBride et al, "Growth of well-defined ZnO microparticles by hydroxide ion hydrolysis of zinc salts", Journal of Materials Chemistry, (2003), 13, pp. 1-7.*

Izaki et al, "Transparent zinc oxide films prepared by electrochemical reaction", Applied Physics Letters, vol. 68, No. 17, Apr. 22, 1996, 2439-2440.*

Nakata et al. "Effects of Thermal Annealing on ZnO Thin-Film Transistor Characteristics and the Application of Excimer Laser Annealing in Plastic-Based ZnO Thin-Film Transistors", Japanese Journal of Applied Physics 48 (2009) 081608.*

Gobel et al, "Thin Films of Conductive ZnO Patterned by Micromolding Resulting in Nearly Isolated Features", ACS Applied Materials and Interfaces, vol. 2, No. 2, pp. 536-543, (2010), published on Web Jan. 15, 2010.*

Zhou et al, "Molecular Interactions of Surfactants in Mixed Monolayers at the Air/Aqueous Solution Interface and in Mixed Micelles in Aqueous Media: The Regular Solution Approach", Langmuir 2003, 19, 4555-4562.*

Schwenzer et al, "Substrate-Induced Growth of Nanostructured Zinc Oxide Films at Room Temperature Using Concepts of Biometric Catalysis", Langmuir 2006, 22, 9829-9831.*

Kisailus et al, "Kinetically Controlled Catalytic Formation of Zinc Oxide Thin Films at Low Temperature", J. Am. Chem. Soc. 2006, 128, 10276-10280.*

Brown et al, "Metal Oxide Surfaces and Their Interactions with Aqueous Solutions and Microbial Organisms", Chem. Rev. 1999, 99, 77-174.*

* cited by examiner (A)

(B)

(C)

(D)

(E)

(F)

(C)

METHODS FOR MAKING LARGE-AREA, FREE-STANDING METAL OXIDE FILMS

CROSS-REFERENCE TO RELATED APPLICATIONS

This application is a divisional of U.S. patent application Ser. No. 12/723,190, filed on Mar. 12, 2010, the entire disclosure of which is incorporated herein by reference.

STATEMENT REGARDING FEDERALLY SPONSORED RESEARCH OR DEVELOPMENT

This invention was made with government support under 0905914 awarded by the National Science Foundation and FA9550-09-1-0482 awarded by the USAF/AFOSR. The government has certain rights in the invention.

BACKGROUND

Zinc oxide is a promising semiconductive material due to its large bandgap and binding energy. In addition zinc is an abundant and relatively expensive alternative to silicon. However, there are significant challenges to making zinc oxide thin films. For example, the techniques used for silicon thin film manufacturing generally cannot be applied to the manufacture of metal oxide films. Although many metal oxide films, including zinc oxide films, can be grown on a solid substrate, there are no known chemical etchants that are able to selectively remove the underlying substrate and allow for the lift-off of the metal oxide film. In addition, although films of polycrystalline metal oxides, such as zinc oxide, can be formed using processes such as sputter deposition and chemical vapor deposition, these polycrystalline films do not have the desirable semiconducting properties that certain single-crystalline metal oxide films can provide.

SUMMARY

One aspect of the present invention provides a continuous, free-standing metal oxide film comprising at least one continuous, single-crystalline metal oxide domain having an area of at least 0.1 $\mu m^2$. In some embodiments the continuous, free-standing metal oxide films have a thickness of no greater than 10 μm. In some embodiments, the at least one continuous, single-crystalline metal oxide domain has an area of at least 1 $\mu m^2$. In still other embodiments, the at least one continuous, single-crystalline metal oxide domain has an area of at least 100 $\mu m^2$. The metal oxide film can be a flexible large-area film, having an area of at least 1 $cm^2$ and a thickness of 1000 nm or less.

Another aspect of the invention provides methods of making metal oxide films. In one embodiment the method comprises forming a surfactant monolayer at the surface of an aqueous solution, wherein the headgroups of the surfactant molecules provide a metal oxide film growth template, and exposing metal ions in the aqueous solution to the metal oxide film growth template in the presence of hydroxide ions under conditions that promote the growth of a metal oxide film on the metal oxide film growth template. Sodium dodecyl sulfate (SDS) is an example of a surfactant that can be used to form the metal oxide film growth template.

Continuous, free-standing zinc oxide films are one example of the type of thin films that are provided by the present invention. In some embodiments of the zinc oxide films, the zinc oxide comprises the wurtzite phase of zinc oxide. In other embodiments, the zinc oxide comprises a $Zn_{0.75}O_x$ structure. Other continuous, free-standing metal oxide films that can be produced using the present methods include magnesium oxide films, copper oxide films, titanium oxide films, tin oxide films and barium titanium oxide films.

Another aspect of the invention provides transistors incorporating the present metal oxide films as a semiconductor active layer.

DETAILED DESCRIPTION

Figure 1:
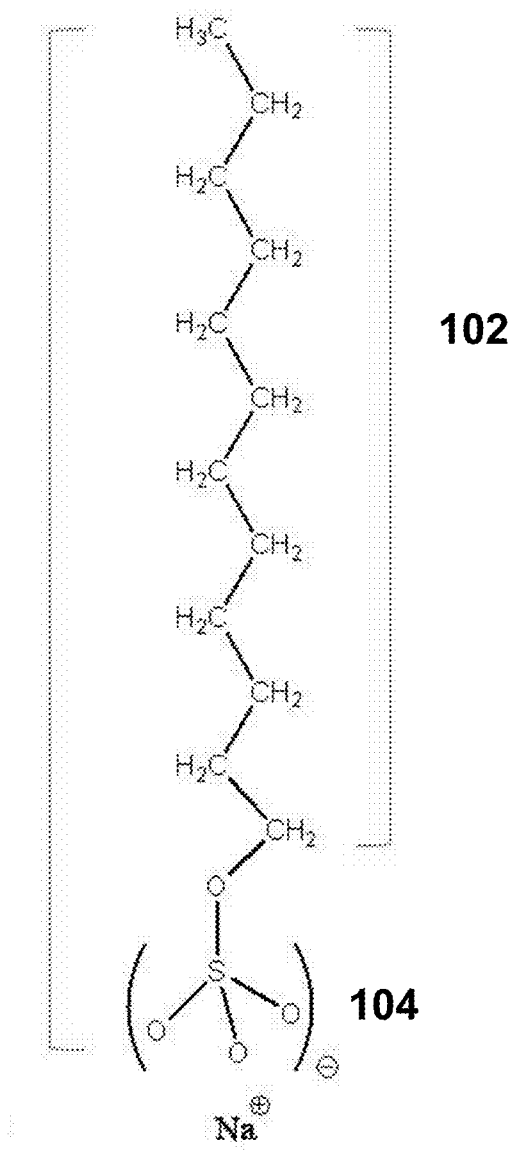
FIG. 1 shows the molecular structure of sodium dodecyl sulfate (SDS).

The present invention provides continuous, free-standing metal oxide films and methods for making and processing said films. The methods are able to produce large-area, flexible, thin films having one or more continuous, single-crystalline metal oxide domains. The flexible metal oxide films can be easily transferred from the surface of the liquid on which they are grown to a variety of substrates, including flexible plastic substrates. In addition, the metal oxide films can be made with a large enough area to be patterned lithographically.

Various embodiments of the metal oxide films can be transparent and/or non-toxic and can have a wide bandgap, high mobility, and/or piezoelectric properties. As such, the present metal oxide films can be used in flexible electronics, including thin film transistors (TFTs), solar cells, light-emitting diodes for the ultraviolet (UV) spectrum, laser diode PN-junctions, and electrodes.

As used herein, the phrase "continuous, free-standing film" refers to a film that is continuous in three dimensions and has a self-supporting structure that does not include an organic binder or matrix and does not include an underlying support substrate that provides it with its self-supporting structural integrity. The "continuous, free-standing films" have a substantially uniform composition in that they are not composed of or from an array or collection of a plurality of discrete nanoparticles, such as nanoparticles, nanowires or nanorods.

In a basic embodiment, the present methods include the steps of forming a surfactant monolayer at the surface of an aqueous solution, wherein the headgroups of the surfactant molecules in the monolayer pack together to provide a soft, organic metal oxide film growth template. When metal ions in the aqueous solution are exposed to the film growth template in the presence of hydroxide ions under suitable conditions, a metal oxide film can be grown from the film growth template in a layer-by-layer fashion downward into the aqueous solution. Thus, the films can be characterized by a thickness dimension extending downward from the film growth template and into the aqueous solution, as well as by length and width dimensions which extend laterally through the film, perpendicular to the thickness dimension.

As illustrated in the Example, below, the metal oxide films can be grown from a plurality of nucleation sites on the film growth template. Because the small single-crystalline metal oxide domains growing at each nucleation site are able to rotate with respect to one another, multiple smaller domains are able to converge into larger, single-crystalline domains within the film. Thus, some embodiments of the present methods are able to produce continuous metal oxide films having at least one continuous, single-crystalline metal oxide domain with an area of at least 0.1 $\mu m^2$, where the area is determined based on the length and width dimensions of the film. This includes embodiments of the methods that produce continuous metal oxide films having at least one continuous, single-crystalline metal oxide domain with an area of at least 1 $\mu m^2$, at least 10 $\mu m^2$, at least 100 $\mu m^2$, or even at least 1000 $\mu m^2$. As illustrated in the Example, below, the single-crystalline domains can be in the form of different phases, depending upon the reactions conditions and the duration of the film growth.

Although the present metal oxide films are exemplified by zinc oxide films in the Example, below, a variety of metal oxide films can be produced using the present methods. These include metal oxide films that cannot be produced using conventional solution phase growth processes. Examples of other metal oxide films that can be grown using the present methods include magnesium oxide films, copper oxide films, tin oxide films, titanium oxide films and barium titanate films.

The surfactants that form the metal oxide film growth template should be chosen such that the charge-bearing headgroup atoms in the surfactant monolayer are sized and spaced to promote the growth of the metal oxide of interest. Thus, the distance between the metal atoms in the growing metal oxide film should be no less than the distance between the charge-bearing atoms of the surfactant headgroups. For example, in some embodiments, the distance between charge-bearing atoms of the surfactant headgroups is about 20 to 30% greater than the distance between the metal atoms of the metal oxide. Sodium dodecyl sulfate is an example of a surfactant having a sulfate headgroup that can be used to form the metal oxide film growth template for the growth of a variety of continuous, free-standing metal oxide films.

The dimensions of the present metal oxide films depend on a variety of factors, including the dimensions of the container in which the films are grown, the reaction conditions and the duration of the film growth process. For example, the film growth conditions can be designed to grow a metal oxide thin film having an area that is limited only by the area of the air-aqueous solution interface in the container in which the reaction is carried out. In some embodiments, the metal oxide film has a surface area of at least 1 $mm^2$. This includes embodiments in which the metal oxide film has a surface area of at least 1 $cm^2$, at least 10 $cm^2$ and at least 100 $cm^2$.

The thickness of the films depends, at least in part, on the concentration of reactants (e.g., a source of hydroxide ions and metal ions) and the temperature and duration of the film growth reaction. If the films are to be used in flexible electronics, they are desirably sufficiently thin to provide a flexible film. For example, in some embodiments, continuous, free-standing metal oxide films having a thickness of up to 10 $\mu m$ are grown. This includes metal oxide films having a thickness of up to 5 $\mu m$, up to 1 $\mu m$, up to 500 nm, up to 100 nm, up to 50 nm, and up to 20 nm. For example, in accordance with various embodiments of this invention, metal oxide films having thicknesses in the range from 10 to 500 nm, from 10 to 100 nm, and from 10 to 50 nm can be grown. An example of an electronic device into which the present metal oxide films can be incorporated is a thin film transistor, in which metal oxide thin films can provide transparent electrodes.

Figure 7:
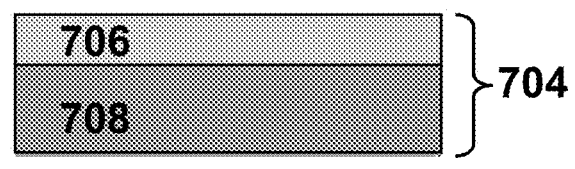
FIG. 7 illustrates a method for making a thin film transistor from a multilayered metal oxide film structure.
Figure 7:
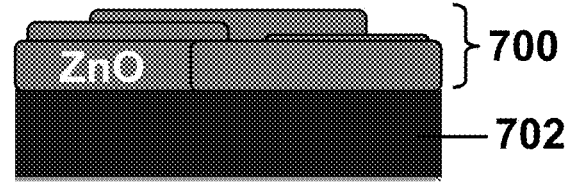
Figure 7:
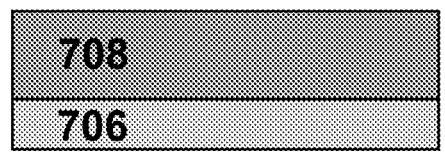
Figure 7:
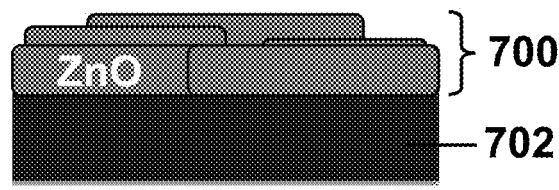
Figure 7:
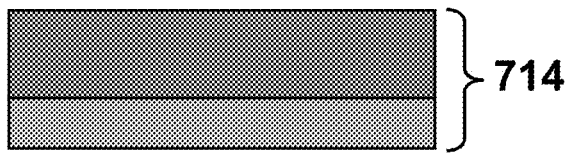
Figure 7:
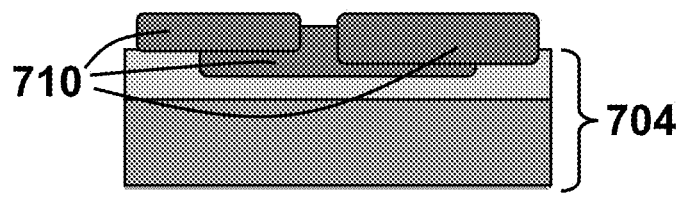
Figure 7:
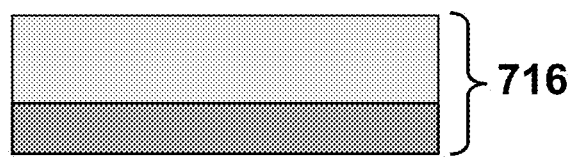
Figure 7:
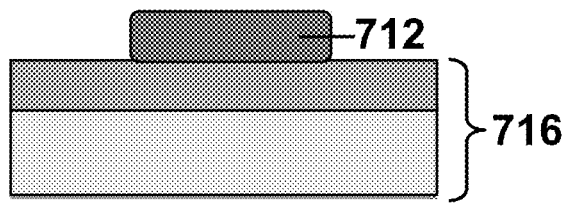
Figure 7:
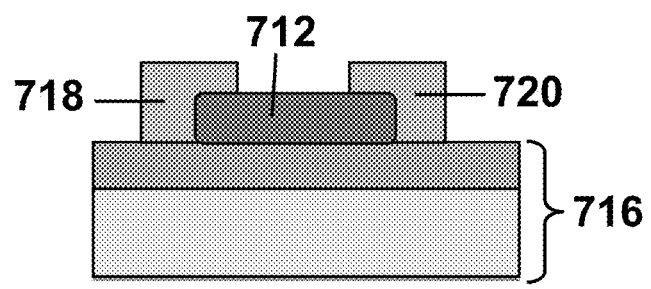
Figure 7:
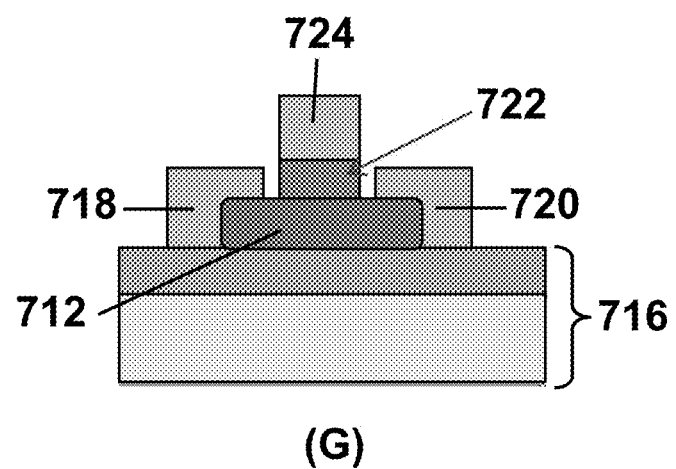
Figure 8:
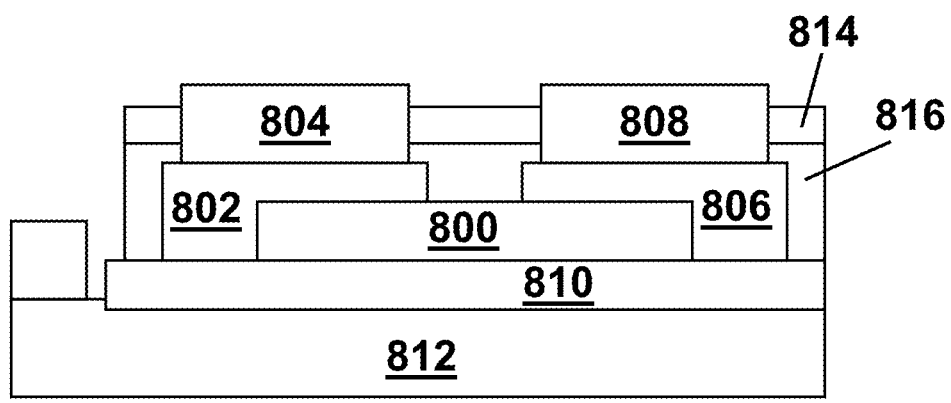
FIG. 8 is a diagram of a bottom-gated thin film transistor incorporating a semiconducting metal oxide film as an active layer.

The as-grown films can be in the form of a multilayered structure comprising a stack of metal oxide films. In order to prepare such multilayered metal oxide film structures for use in devices, such as TFTs, the thin film layers should be separated. FIG. 7 illustrates a method for separating the metal oxide thin films in a multilayered structure and forming a TFT from a single metal oxide film. In this method a multilayered metal oxide film structure 700 is disposed on a substrate 702. A second, adhesive substrate 704 is prepared. The adhesive substrate can include an adhesive layer 706 (e.g., SU-8) and a flexible polymeric layer 708 (e.g., polyethylene teraphthlate). The adhesive substrate 704 is contacted with one or more of the top metal oxide film layers of the multilayered structure 710. When the adhesive substrate is lifted away from the multilayered structure, the top metal oxide film layers 710 are separated. This "adhere, lift and separate" process can be repeated multiple times until a single layer of metal oxide film 712 remains on an adhesive structure. In the example of FIG. 8, the process is repeated with a second adhesive substrate 714 and a third adhesive substrate 716. A TFT can be fabricated from the resulting structure by depositing a source electrode 718, a drain electrode 720, a gate dielectric 722 and a gate electrode 724 onto the metal oxide active layer 712.

An example of a bottom-gated TFT is shown in FIG. 8. This TFT includes a metal oxide film 800 as an active layer, a source electrode 802, a metal contact 804 for the source electrode, a drain electrode 806, a metal contact 808 for the drain electrode, a gate dielectric 810, a gate electrode 812 and an insulating layers 814, 816.

EXAMPLE

This example describes the formation of continuous single-crystallizing zinc oxide films in accordance with the present invention.

Synthesis:

A reaction vial containing 25 millimolar (mM) zinc nitrate, 25 mM hexamethylenetetramine (HMTA), and 10 mM sodium dodecyl sulfate (SDS) solution was placed in a convection oven set at 60° C. After the reaction was conducted for 5 hours, a continuous visible zinc oxide film formed on the surface of the reaction solution, covering the entire water-air interface. The film is free-standing and can be transferred onto various substrates just by immersing a substrate in the solution and carefully lifting the film with the substrate.

Although the reaction of this example is desirably conducted at a temperature of at least 60° C., any temperature from about 60° C. to 90° C. can also be employed. Concentrations other than 25 mM for zinc nitrate and HMTA can also be employed. For example, the reaction can be carried out at zinc nitrate and HMTA concentrations from 10 mM to 100 mM. The concentrations of these two chemicals are related to each other. The molar ratio of HMTA to zinc nitrate is usually 1:1, but can also be, for example, up to 2:1 (that is, the concentration of HMTA can be larger, but should not be smaller than that of zinc nitrate). The concentration of SDS can be in the range from 5 mM to 40 mM, for example. This concentration can be independent from the concentrations of the other two chemicals.

A continuous zinc oxide film covering the entire surface of the aqueous solution can be achieved within one hour after the reaction starts. Longer reaction times can be used to obtain larger single crystal domains within the metal oxide film.

The reaction container in which the metal oxide film is grown can have any suitable shape and size, and can be made of a variety of materials. Suitable materials for the reaction container include glass, plastic, PTFE and the like.

Growth Mechanism:

Zinc nitrate is used in this example to provide zinc cations when it is dissolved in water. HTMA is an organic base that hydrolyzes in water and generates ammonia and formaldehyde at a slow rate. Ammonia is a weak base in water and hydrolyzes automatically to release hydroxide anions. Zinc cations and hydroxide anions react and generate zinc hydroxide, which is further dehydrated to provide zinc oxide. The chemical reactions are as follows:

$$(CH_2)_6N_4 + 6H_2O \leftrightarrow 4NH_3 + 6HCHO$$

$$NH_3 + H_2O \leftrightarrow NH_3.H_2O$$

$$NH_3.H_2O \leftrightarrow NH_4^+ + OH^-$$

$$Zn^{2+} + 2OH^- \leftrightarrow Zn(OH)_2$$

$$Zn(OH)_2 \xrightarrow{\Delta} ZnO + H_2O$$

SDS is a widely used anionic surfactant with a 12-carbon hydrocarbon chain, a sulfate anion headgroup, and a sodium cation counter ion. FIG. 1 shows a detailed molecular structure of SDS, which includes a hydropholic hydrocarbon chain 102 and a hydrophilic head group 104. When dissolved in water, SDS is ionized. The sodium cations are uniformly dissolved while the amphiphilic dodecyl sulfate anions are absorbed at the surface of the solution and form an electrical negative layer with the hydrophobic surfactant chains pointing up (away from the solution) and the anionic headgroups pointing down (buried in the solution). A very large amount of SDS (e.g., a concentration near or larger than the critical micelle concentration of, about 9 mM) was added to the reaction system to ensure a saturated surface absorption and tight packing of the surfactant molecules. As a result, the dodecyl sulfate groups form a negatively charged molecular monolayer at the liquid solution-air interface.

Figure 2:
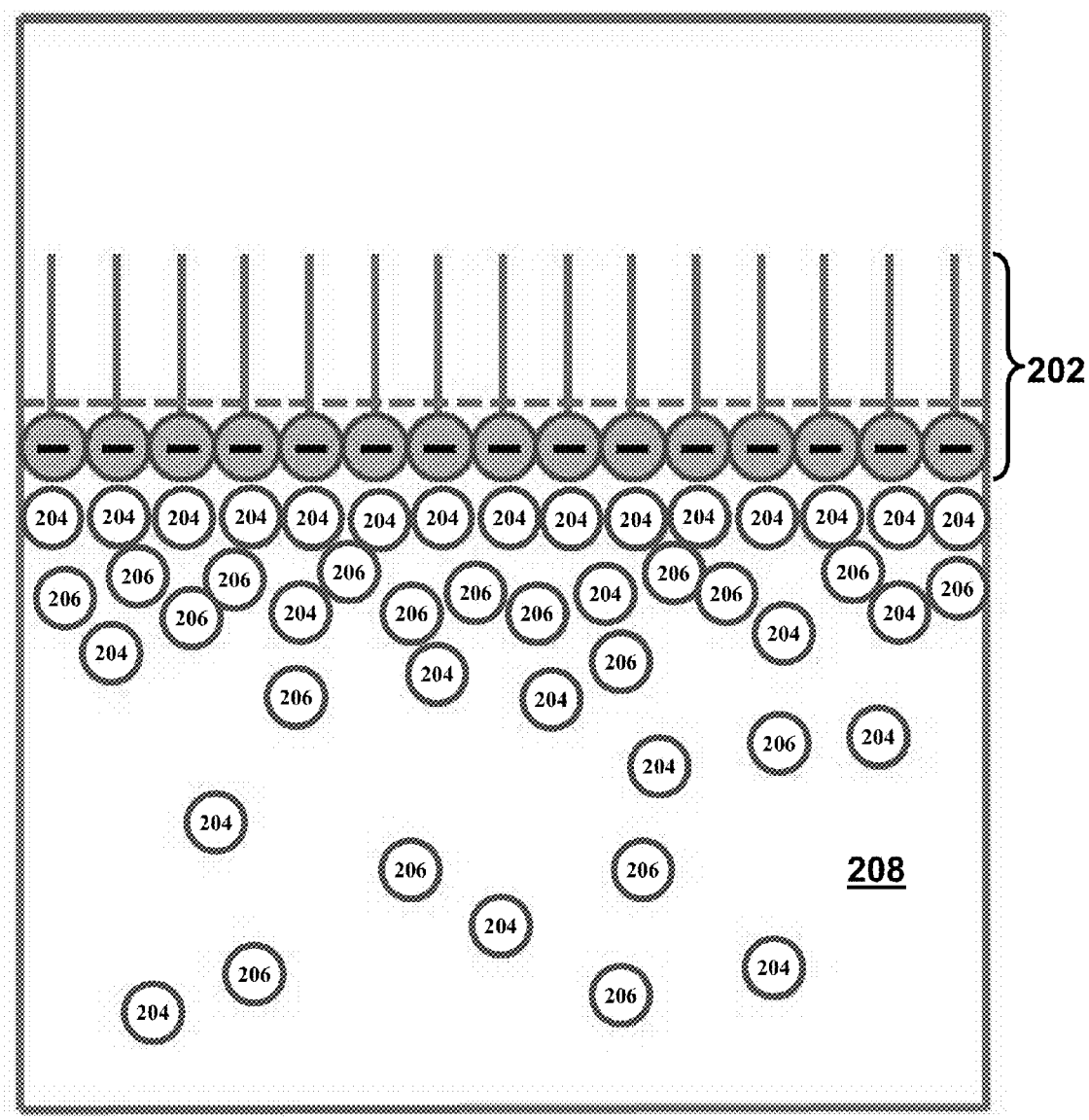
FIG. 2 is an illustration of the spatial distribution of dodecyl sulfates, zinc cations and hydroxide anions in a reaction container.

This negatively charged molecular monolayer serves as a two-dimensional soft planar template for the growth of the metal oxide film. This planar template has strong interactions with both zinc cations and the surface of the growing zinc oxide film. Since each divalent zinc cation carries two positive charges, they are concentrated near the negatively charged template due to coulombic forces. The concentrated zinc cations also accelerate hydroxide anion diffusion to the surface of the aqueous solution where they react with the zinc cations and generate zinc oxide at the template. The spatial distribution of dodecyl sulfates 202, zinc cations 204, and hydroxide anions 206 in the reaction solution 208 are illustrated in FIG. 2.

Figure 3:
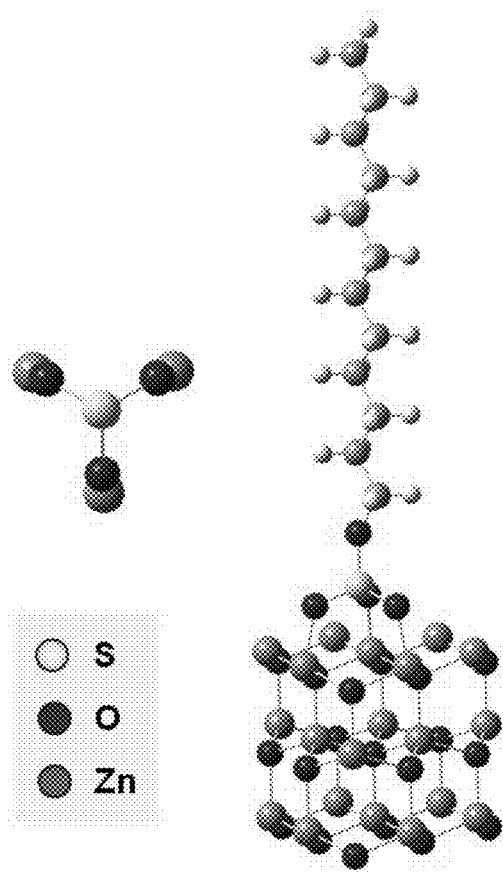
FIG. 3 shows the proposed interaction between dodecyl sulfate headgroups and a zinc oxide (0001) surface.

The planar metal oxide growth template formed by the surfactant molecules also has strong affinity with the (0001) surface of zinc oxide. Each dodecyl sulfate group has a −1 charge, which is equally distributed to its three oxygen atoms that are not bonded to a carbon atom. On the other hand, the (0001) surface of zinc oxide is composed of only zinc cations and thus is positively charged. Therefore, there is coulombic force between the template and zinc oxide surface, in particular, the (0001) surface of the zinc oxide nuclei formed underneath the template. Moreover, the partially negatively charged oxygen atoms of the dodecyl sulfate molecules can act like the (000−1) surface of zinc oxide, so it is very likely that these oxygen atoms bond with zinc cations on the (0001) surface in the same way that the oxygen anions and zinc cations do in a zinc oxide crystal. Due to this atomic configuration, these oxygen atoms can provide a transition area between the zinc oxide film and the dodecyl sulfate template. A proposed mechanism for the interaction between a dodecyl sulfate group and the zinc oxide (0001) surface of a growing zinc oxide film is illustrated in FIG. 3.

Figure 4:
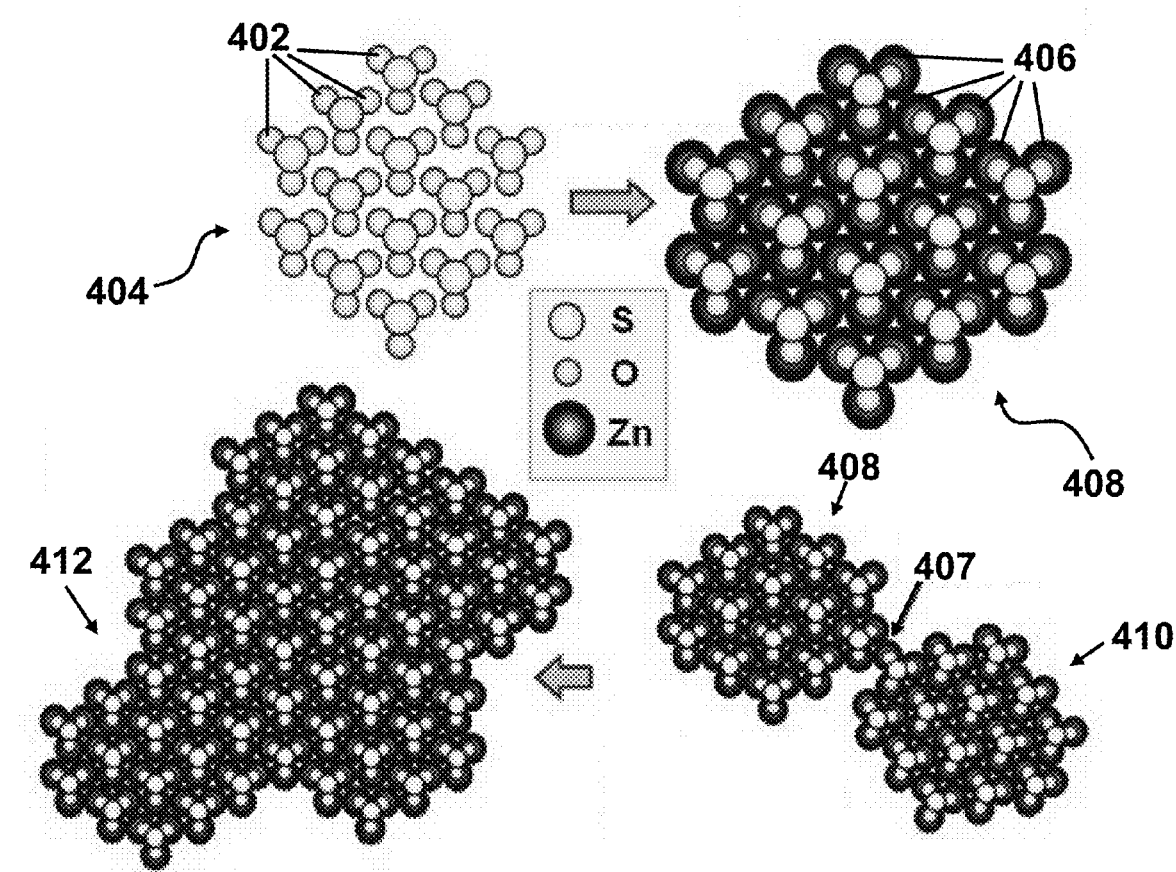
FIG. 4 shows the proposed mechanism for the formation of a large area zinc oxide single crystal film.

The present methods employ a soft organic metal oxide growth template that allows nucleation sites to rotate such that the single-crystalline metal oxide domains growing at neighboring nucleation sites are able to converge into a single, continuous, single-crystalline domain. Specifically, the smaller nucleation sites can rotate around their c-axis until they adopt an orientation that matches that of the other nucleation sites. As the smaller single-crystalline domains merge into a larger single-crystalline domain, the supply of zinc cations and hydroxide anions help to "sew together" the edges. FIG. 4 illustrates the formation mechanism of a ZnO film.

As shown in FIG. 4, the surfactant headgroups 402, shown here as SDS head groups, self-organize into a growth template 404 on the surface of the growth solution. The oxygen atoms in the head group then bind with Zn atoms 406 from the solution to provide a growing single-crystalline domain 408. Bonding 407 between growing domains 408, 410 can occur and the resulting bonds can pull the smaller domains together to form a single, larger, single-crystalline domain 412.

It is commonly believed that the (0001) surface grows faster than any other surfaces of zinc oxide and the (000−1) surface is an inert surface, that is, it grows slowest. In the present methods, the (0001) surface is associated with the dodecyl sulfate groups of the surfactant molecules and faces toward the water surface, while the inert (000−1) surface faces down toward the aqueous bulk phase. Therefore, the zinc oxide grows laterally and forms in the morphology of a thin film.

Figure 5:
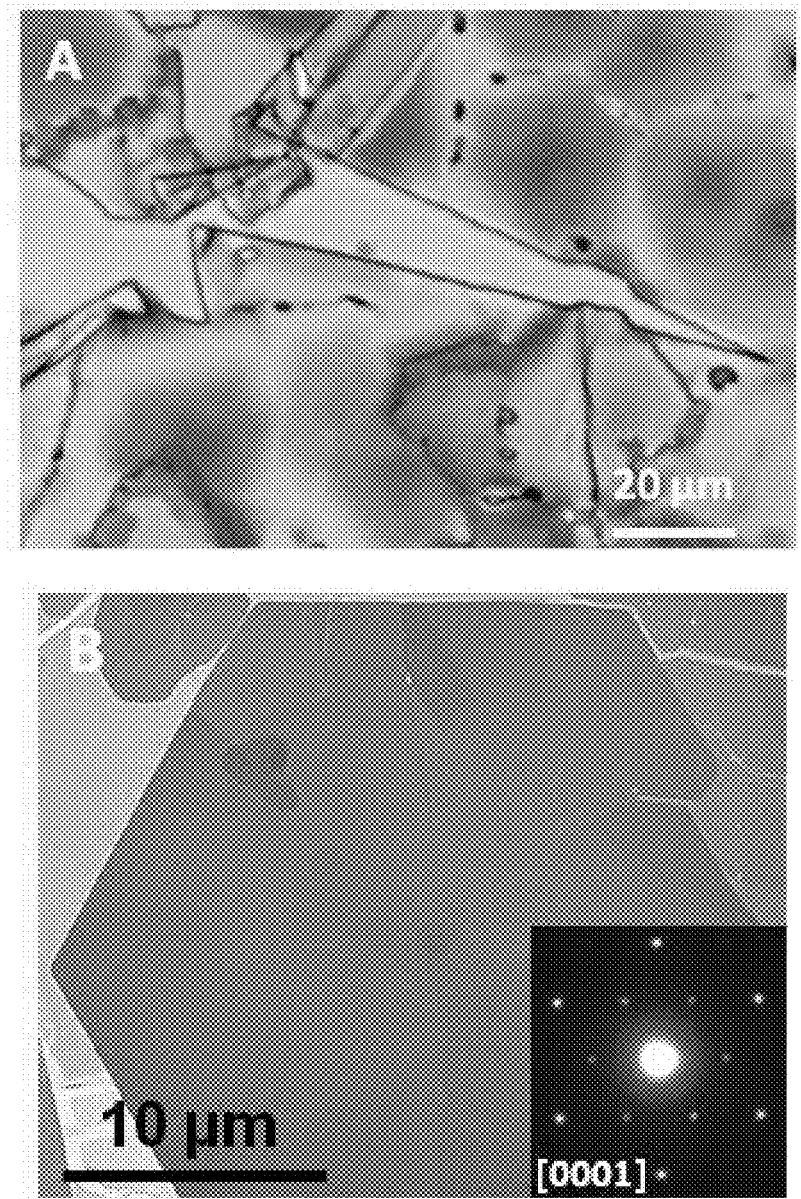
FIG. 5 shows a free standing ZnO film. A. An optical microscope image of a ZnO film supported on a silicon substrate. B. A TEM image of a ZnO film; the inset is the diffraction pattern taken from the film.

An image of a zinc oxide film made in accordance with the present methods is shown in FIG. 5A. The single-crystalline domain can reach an area of hundreds of square micrometers, or greater. The thickness of the ZnO film can range, for example, from tens to hundreds of nanometers depending on the growth time and temperature. Most of the single-crystalline pieces still exhibit a hexagonal shape as shown in FIG. 5B. The corresponding electron diffraction pattern revealed a c-plane orientation (inset of FIG. 5B).

Figure 6:
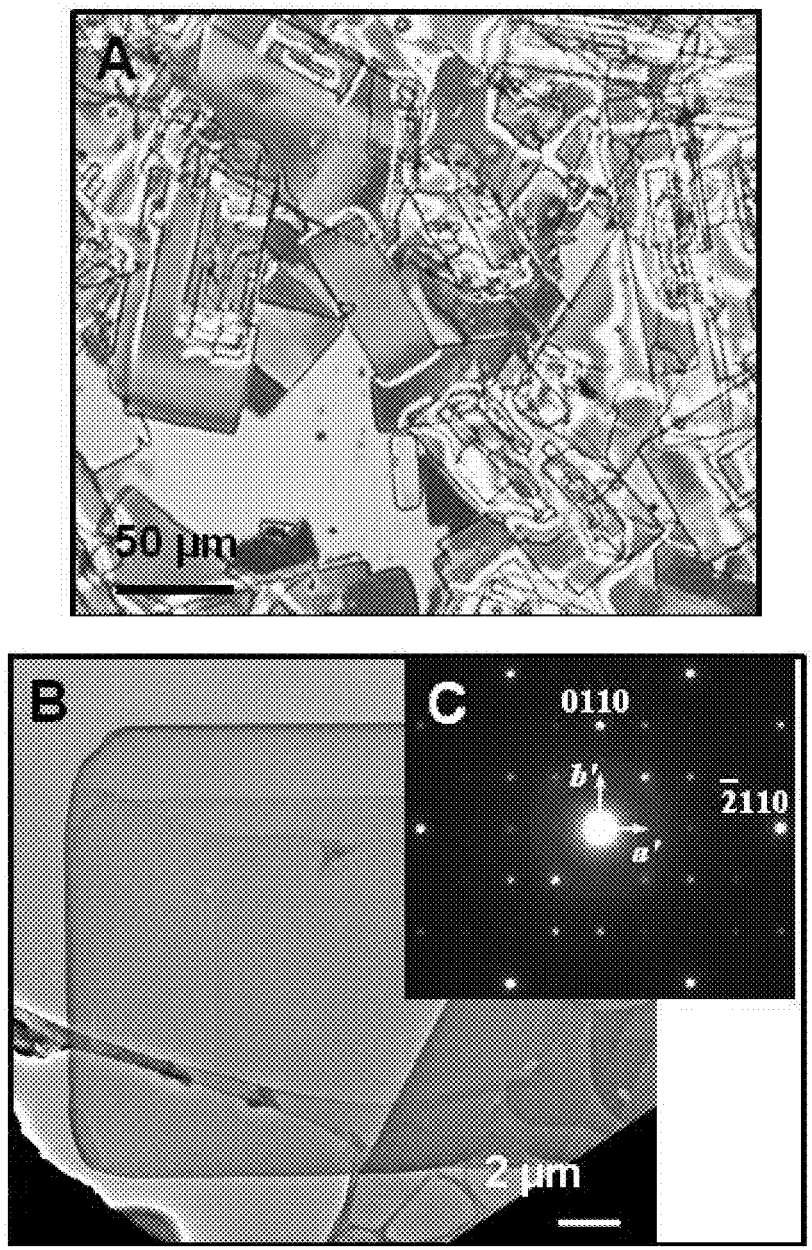
FIG. 6 shows: (A) an optical microscopy image of the zinc oxide square crystals; (B) the transmission electron microscopy image of the zinc oxide square crystal, as well as (C) its electron diffractions pattern; and (D) an illustration of the proposed mechanism for binding dodecyl sulfates with the (0001) surface of a zinc oxide square crystal.
Figure 6:
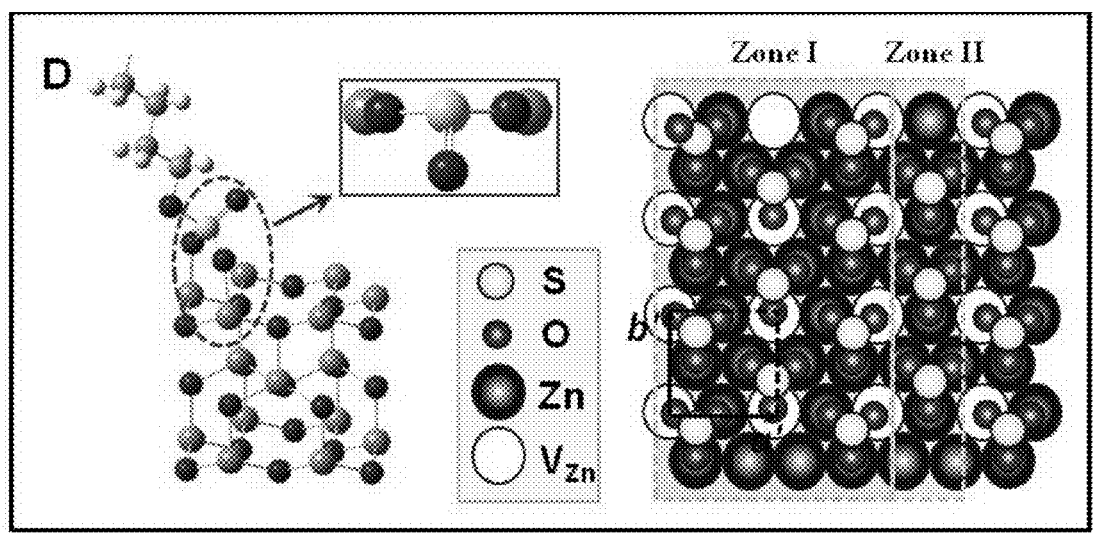

Formation of Zinc Oxide Square Crystals:

When the reaction time was extended to more than 10 hours, the morphology of the single crystal zinc oxide domain changed from hexagonal crystal to square crystal. This is shown in FIG. 6A. The crystal structure also changed from the common Wutzite structure (hexagonal) to a zinc vacancy-induced rectangular structure. For the purposes of this disclosure, this structure is referred to as the "square phase". The corresponding TEM image and electron diffraction pattern

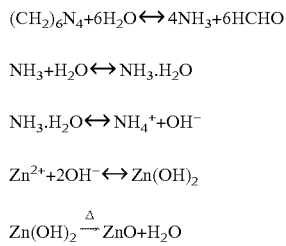

are shown in FIGS. 6B and C, respectively. This square phase is also known as the $Zn_{0.75}O_x$ structure, and is described in Ding et al, Solid State Communications, Vol. 138, pp. 390-394 (2006).

The transition from hexagonal crystal to this square phase is believed to be due to the surface change imbalance of the hexagonal crystal. As was discussed previously, each dodecyl sulfate anion has a charge of −1, which is equally distributed to the three oxygen atoms that bind with the zinc cations on the zinc oxide (0001) surface. That is, each oxygen atom has −⅓ charge. On the other hand, each zinc cation on the zinc oxide (0001) surface has a positive one half charge. Therefore, the surface charge of the zinc oxide (0001) surface is not fully neutralized by dodecyl sulfate anions. The surface charge imbalance is 33%. Given a long reaction time, both the dodecyl sulfate anions and zinc oxide crystal can reorganize themselves to eliminate the charge imbalance. Eventually, one of the three oxygen-zinc bonds formed between the dodecyl sulfate group and zinc oxide crystal will break. Thus, the −1 charge of the dodecyl sulfate anion is now shared by two oxygen anions, which are bonded with two zinc cations. Under this situation, the charge between the SDS and zinc oxide is completely balanced and the entire system reaches a more stable state.

Such reorganization will generate a significant number of zinc vacancies in the zinc oxide crystal. Considering the crystal structure of zinc oxide, one stable phase for zinc oxide having a large number of zinc vacancies is a phase in which the zinc oxide crystal loses one quarter of its zinc cations (left of FIG. 6D). Since the number of dodecyl sulfate anions that are absorbed on the zinc oxide (0001) surface in unit area remains the same, the surface charge imbalance can be reduced to 11% through this reorganization. As illustrated in FIG. 6D, this configuration creates two types of zones on the zinc oxide (0001) surface. In Zone I, each dodecyl sulfate group is bonded with two zinc cations. The charge between the surfactant and the crystal is completely balanced in this region. This region contains ¾ of the total SDS molecules. Another one quarter of the SDS molecules are located in zone II, where they bond with three zinc cations. Therefore, the charge in this region is still unbalanced. Nonetheless, stabilization of the zinc oxide crystal and the interface charge together make this square phased zinc oxide thin film into a stable structure.

Figure 9:
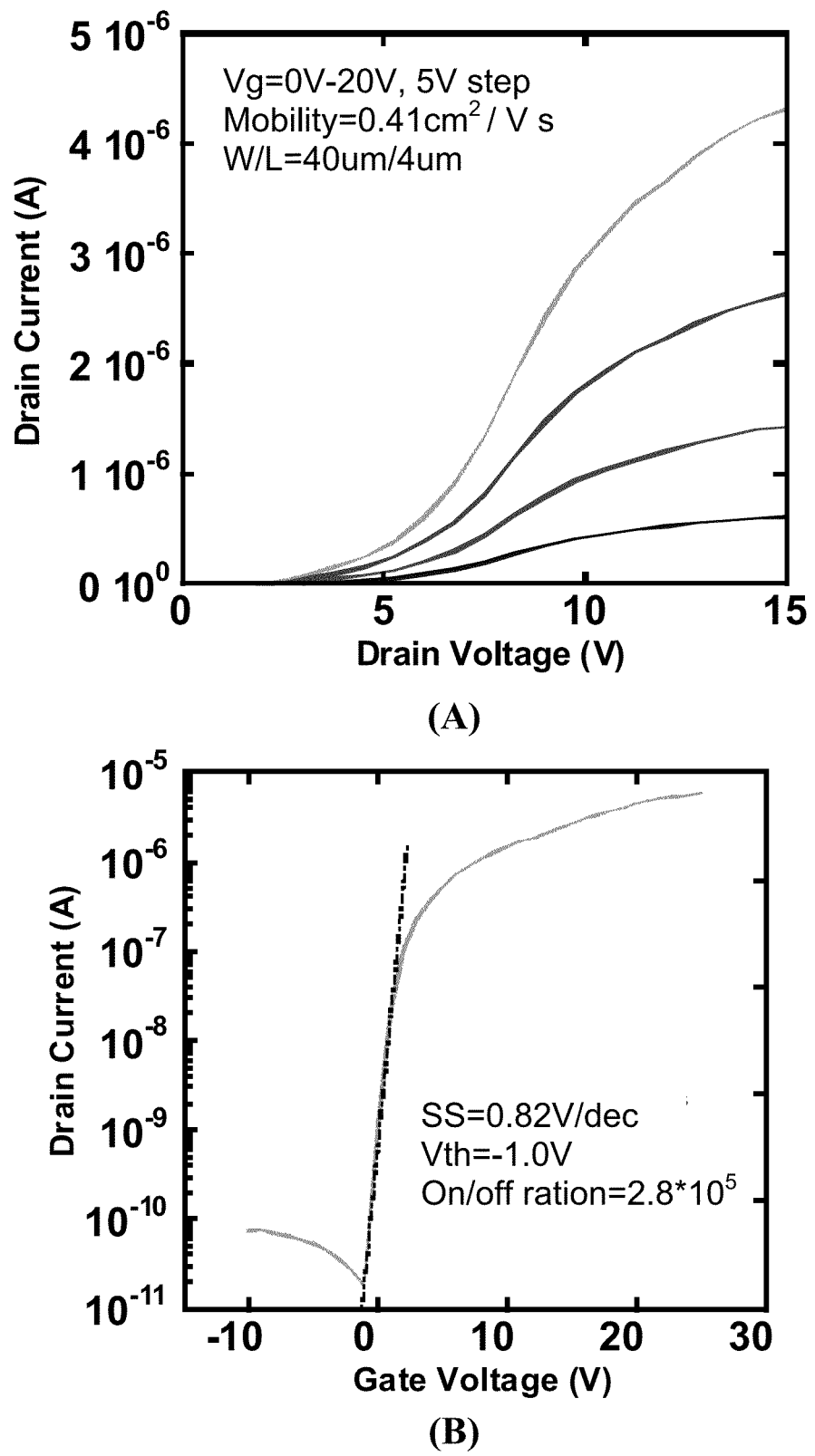
FIG. 9(A) shows the drain current as a function of drain voltage at various gate voltages for a thin film transistor incorporating a ZnO film.
FIG. 9(B) shows the on/off ratio for the thin film transistor.
FIG. 9(C) shows a comparison of the on/off ratio for the thin film transistor made with an annealed ZnO film to the on/off ratio for a thin film transistor without an anneal step
Figure 9:
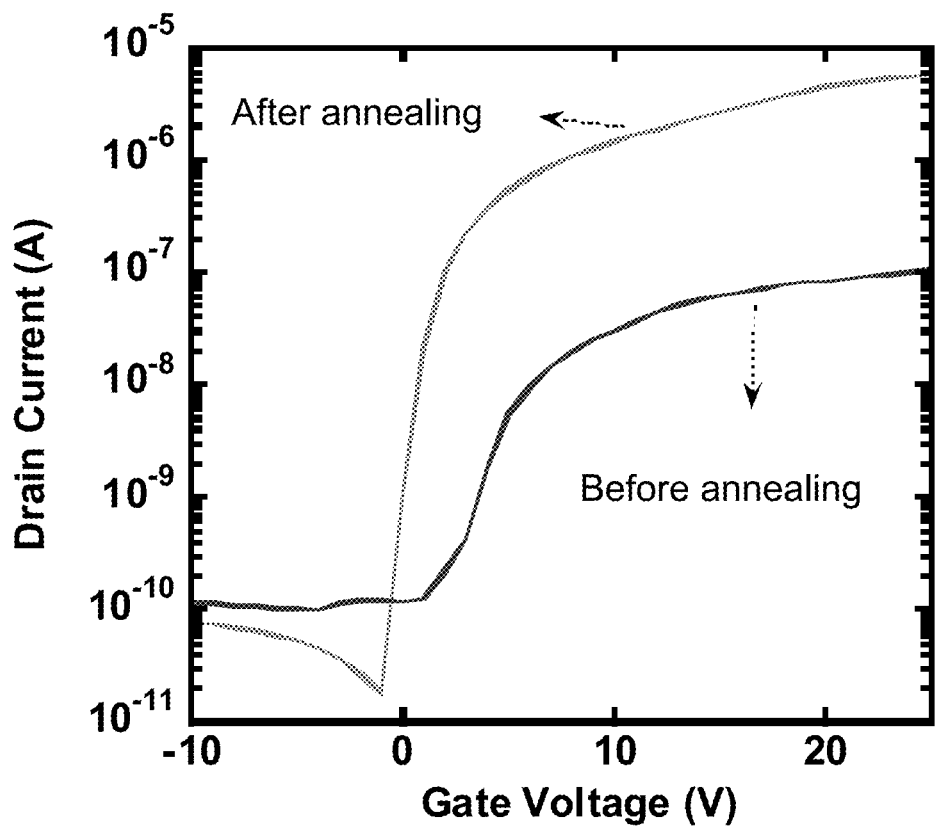

The as-grown metal oxide films may take the form of a multilayered structure comprising a stack of two of more metal oxide films. If this is the case, the multilayered structures can be further processed to render them suitable for use in electronic applications, such as TFTs. This further processing includes lifting the multilayered structure from the growth solution with a substrate and annealing the structure to drive out moisture and passivate the film surfaces. For example the ZnO films can be annealed at 300° C. for 100 minutes. A single ZnO film can then be separated onto an adhesive substrate using the method illustrated in FIG. 7. The performance characteristics for a bottom-gated TFT made using these methods are shown in FIG. 9. The materials in this TFT are a ZnO active layer, a $SiO_2$ gate dielectric, a heavily doped Si gate electrode, and $SiO_2$ and $SiN_x$ insulating layers. FIG. 9(A) shows the drain current as a function of drain voltage at various gate voltages. FIG. 9(B) shows the on/off ratio for the device. FIG. 9(C) shows a comparison of the on/off ratio for the TFT made with the annealed ZnO film to the on/off ratio for a TFT without an anneal step.

As used herein, and unless otherwise specified, "a" or "an" means "one or more." All patents, applications, references, and publications cited herein are incorporated by reference in their entirety to the same extent as if they were individually incorporated by reference.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art, all language such as "up to," "at least," "greater than," "less than," and the like includes the number recited and refers to ranges which can be subsequently broken down into subranges as discussed above. Finally, as will be understood by one skilled in the art, a range includes each individual member.

It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A method of making a metal oxide film, the method comprising:
   (a) forming a surfactant monolayer at an air-aqueous solution interface at the surface of an aqueous solution, wherein the headgroups of the surfactant molecules provide a metal oxide film growth template; and
   (b) exposing metal ions to the metal oxide film growth template in the presence of hydroxide ions under conditions that promote the growth of a metal oxide film from the metal oxide film growth template downward into the aqueous solution.

2. The method of claim 1, wherein the metal ions are zinc ions.

3. The method of claim 2, wherein the surfactant molecules are dodecyl sulfate molecules.

4. The method of claim 2, wherein the metal oxide film comprises zinc oxide having a wurtzite structure.

5. The method of claim 4, wherein the metal oxide film is a continuous, free-standing metal oxide film and comprises at least one continuous, single-crystalline zinc oxide domain that is characterized by a hexagonal lattice parameter.

6. The method of claim 2, wherein the metal oxide film comprises zinc oxide having a $Zn_{0.75}O_x$ structure.

7. The method of claim 6, wherein the metal oxide film is a continuous, free-standing metal oxide film and comprises at least one continuous, single-crystalline zinc oxide domain that is characterized by a rectangular lattice parameter.

8. The method of claim 1, wherein the metal oxide film is a continuous, free-standing metal oxide film and comprises at least one continuous, single-crystalline metal oxide domain having an area of at least 0.1 μm².

9. The method of claim 1, wherein the metal oxide film has a surface area of at least 1 cm².

10. The method of claim 1, wherein the metal ions comprise at least one of magnesium ions, copper ions, titanium ions, tin ions or barium ions.

11. The method of claim 1, wherein the metal oxide film has a thickness of no greater than about 1000 nm.

12. The method of claim 1, further comprising transferring the metal oxide film from the aqueous solution to a substrate.

13. The method of claim 12, wherein the substrate is a flexible plastic substrate.

14. The method of claim 12, further comprising lithographically patterning the metal oxide film.

15. The method of claim 12, further comprising incorporating the metal oxide film into a thin film transistor, a solar cell, a light-emitting diode for the ultraviolet or a laser diode.

* * * * *